United States Patent
Harada

(10) Patent No.: US 7,615,846 B2
(45) Date of Patent: Nov. 10, 2009

(54) SEMICONDUCTOR DEVICE

(75) Inventor: Tatsuo Harada, Chiyoda-ku (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 11/967,718

(22) Filed: Dec. 31, 2007

(65) Prior Publication Data

US 2009/0020852 A1  Jan. 22, 2009

(30) Foreign Application Priority Data

Jul. 17, 2007  (JP) ............................. 2007-185520

(51) Int. Cl.
*H01L 29/739* (2006.01)

(52) U.S. Cl. ..................... 257/579; 257/578

(58) Field of Classification Search ................ 257/578, 257/579, E29.027, E29.066, E29.197, E29.201, 257/E21.382

See application file for complete search history.

(56) References Cited

U.S. PATENT DOCUMENTS 5,623,152 A * 4/1997 Majumdar et al. .......... 257/330
6,781,199 B2 * 8/2004 Takahashi ................... 257/330

FOREIGN PATENT DOCUMENTS

| JP | 2001-168333 | 6/2001 |
|----|-------------|--------|
| JP | 2002-100770 | 4/2002 |
| JP | 2005-158850 | 6/2005 |

* cited by examiner

*Primary Examiner*—Wai-Sing Louie
*Assistant Examiner*—Bilkis Jahan
(74) *Attorney, Agent, or Firm*—Oblon, Spivak, McClelland, Maier & Neustadt, L.L.P.

(57) ABSTRACT

An emitter layer is provided in stripes in a direction orthogonal to an effective gate trench region connected to a gate electrode and a dummy trench region isolated from the gate electrode. A width of the emitter layer is determined to satisfy a predetermined relational expression so as not to cause latch-up in an underlying P base layer. In the predetermined relational expression, an upper limit value of the width W of the emitter layer is $(3500/R_{spb}) \cdot W_{so} \cdot \exp(\text{decimation ratio})$, where $R_{spb}$ is a sheet resistance of the P base layer immediately below the emitter layer, $W_{so}$ is an interval between the trenches, and the decimation ratio is a ratio of the number of the effective gate trench region to the total number of the trench regions. Variations in saturation current in a trench IGBT can be suppressed, and a tolerance of an Reverse Bias Safe Operation Area can be improved.

5 Claims, 5 Drawing Sheets

W: Wso, Rspb, UPPER LIMIT VALUE IS DETERMINED CONSIDERING DECIMATION RATIO

FIG.7
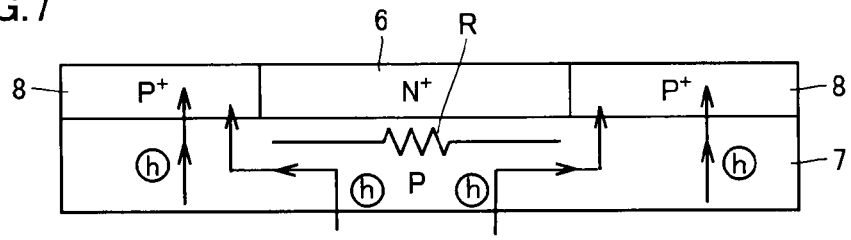
FIG.8
EMITTER WIDTH W-RBSOA
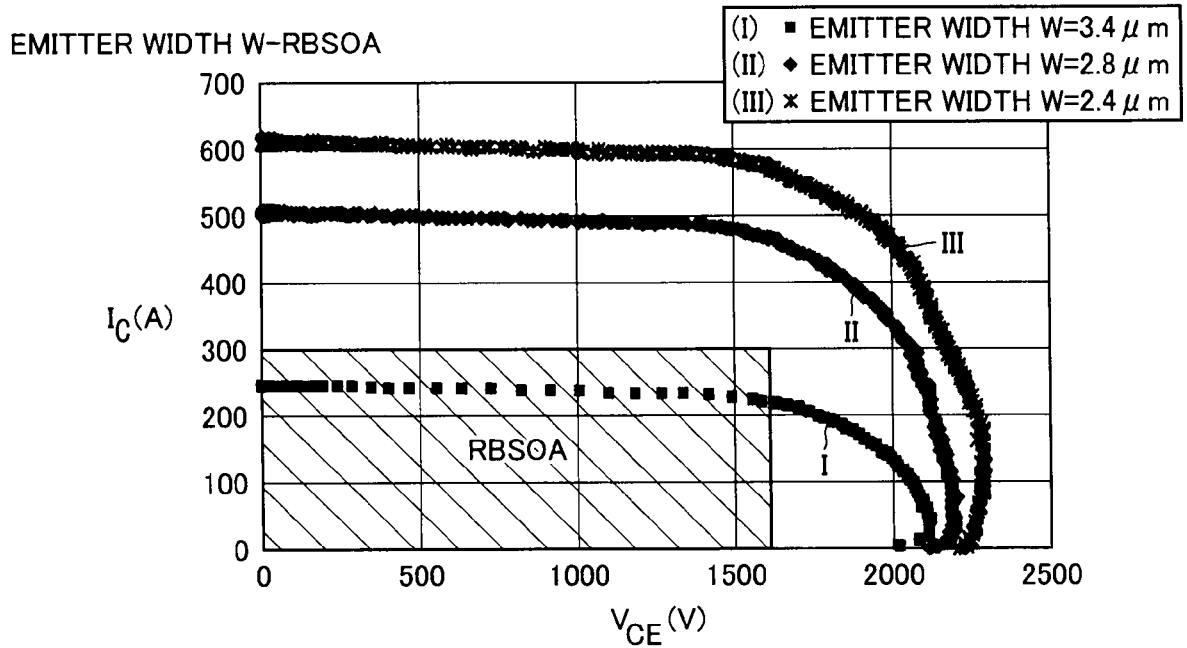
FIG.9 SHORT CIRCUIT DUE TO SIDE DIFFUSION IS PREVENTED
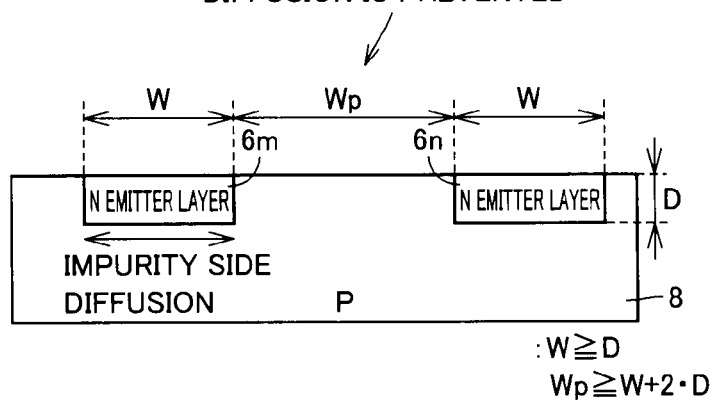

| INTERVAL Wp BETWEEN EMITTER LAYERS | Rspb(Ω/□) | | |
|---|---|---|---|
| | 4600 | 4100 | 3400 |
| 3.0 μm | - | × | - |
| 4.0 μm | × | ○ | ○ |
| 5.0 μm | × | ○ | ○ |

CONDITIONS: $I_C$=500A, $V_{CE}$=1700V,
W=2.8 μm, Wso=2.6 μm,
DECIMATION RATIO m=1/3, EMITTER DIFFUSION DEPTH (D)=0.5 μm

SEMICONDUCTOR DEVICE

BACKGROUND OF THE INVENTION

1. Field of the Invention

The present invention relates to a semiconductor device, and in particular to a power semiconductor device for driving high power. More specifically, the present invention relates to a structure for suppressing variations in saturation current in an IGBT (Insulated Gate Bipolar Transistor) having a trench gate structure.

2. Description of the Background Art

Power transistors are widely used for power conversion or control. One type of such power transistors is an insulated gate bipolar transistor (IGBT). The IGBT generally has an emitter layer of a first conductivity type, a base layer of a second conductivity type, a drift layer (base layer) of the first conductivity type, a collector layer of the second conductivity type, and a gate electrode formed facing the base layer and the drift layer with an insulating film interposed in between. A channel is formed in the base layer by applying a voltage to the gate electrode. Minority carriers (holes) are injected from the collector layer to the drift layer to cause conductivity modulation in the drift layer to reduce the resistance of the drift layer, and accordingly on-voltage upon conduction is reduced.

In such an IGBT, a trench IGBT having a gate electrode formed in a trench form is employed to reduce on-voltage and to reduce a chip area. An example of a configuration of such a trench IGBT is disclosed in Document 1 (Japanese Patent Laying-Open No. 2005-158850). Document 1 describes, as prior art thereof, a structure having an emitter region linearly formed in stripes to be orthogonal to a trench region, and discloses that the emitter region of such stripe form provides an effect as described below.

Specifically, Document 1 assumes a structure as described below as a starting structure of a trench gate IGBT. An emitter region is formed in a ladder form. This ladder-form emitter structure has an emitter region continuously extending along a side wall of the trench, and an emitter region of stripe form formed continuously and linearly with the emitter region formed on the side wall of an adjacent trench. In such ladder-shape emitter structure, a region in which a collector to emitter current flows is widened, and the saturation current is increased. In order to reduce the saturation current, the emitter region is simply formed in stripes to be orthogonal to the trench region.

Further, Document 1 develops the following arguments based on the finding that in order to reduce an on-voltage in the stripe-like emitter structure, it is necessary to set an area ratio between an area of the emitter region and an area of a channel P region (a base region disposed adjacent to the emitter region for making electrical contact with an emitter electrode) to an appropriate value. Specifically, when a surface area of the emitter region is preferentially determined to set the area ratio between the area of the emitter region and the area of the channel P region appropriately, a width of the emitter region formed on the side wall of the trench is determined according to its surface area, and saturation current cannot be adjusted. Conversely, when the width of the emitter region is preferentially determined to reduce the saturation current, the surface area of the emitter region is determined according to its width, and the area ratio between the area of the emitter region and the area of the channel P region cannot be adjusted. To solve such a trade-off problem, in Document 1, the emitter region is segmented along the trench region, and the width of the emitter region is made different for a contact region on the channel P region (base layer) and for the side wall of the trench. Thereby, the surface area of the emitter region is adjusted by adjusting one of the two widths of the emitter region, to reduce both saturation current and on-voltage concurrently.

Document 2 (Japanese Patent Laying-Open No. 2001-168333) discloses a structure for reducing transport current loss in a trench IGBT. In the structure described in Document 2, a dummy trench is provided in a region in which a P base layer and an emitter electrode are connected. With the dummy trench, an area of an ejection path for minority carriers (holes) ejected from the P base layer to the emitter electrode is reduced to increase the ejection resistance for reducing transport current loss. Specifically, with the dummy trench, an area of a current flowing path in an N-type drift layer is reduced, and thus a resistance of a path through which holes are ejected from the N-type drift layer (base layer) to the emitter electrode is increased. Thereby, holes are accumulated in an N-type base layer (drift layer) immediately below an effective trench gate serving as a gate. It is intended to increase a resistance against holes ejected to the emitter electrode and increase an amount of holes in the N-type drift layer, accordingly to increase an amount of electrons injected from the emitter electrode and increase injection efficiency of electrons, and thereby to reduce transport current loss.

When the emitter region is formed along the trench region as in the ladder-shape emitter structure as shown in Document 1, saturation current may possibly vary for each unit cell. Specifically, when forming a trench, firstly an emitter region is formed by impurity diffusion, and then the trench is formed. Therefore, when mask misalignment occurs between the trench and the emitter region, variations are caused in the length of the emitter layer and thus in the area of the emitter layer, and accordingly in the area of the region through which a collector to emitter current flows.

In contrast, when the emitter region is formed in stripes extending in a direction orthogonal to the trench, even if misalignment of a mask for the trench region occurs, the misalignment occurs in each trench at the same time, and thus variations in the stripe-like emitter region can be avoided. However, as discussed in Document 1, there is raised a trade-off problem concerning optimization of on-voltage and saturation current. Further, when the emitter region is formed in stripes, a problem described below is also raised, although it is not discussed in Document 1.

Specifically, when an IGBT is turned off, a collector current is cut off. In this operation, turn-off surge voltage is generated according to a current change rate di/dt due to an inductive load (including an interconnect). The surge voltage is added to collector to emitter voltage. When the emitter region is narrow in width, a large voltage is applied across a junction between the emitter and the base and breaks down the junction, which leads to element breakdown and raises a problem of narrowing an RBSOA (Reverse Bias Safe Operation Area). Conversely, when the emitter region is too wide, a base layer immediately below the emitter region becomes large in resistance. In this case, in an npnp parasitic thyristor formed of an emitter/base/drift layer (epitaxial layer)/collector layer, there arise a problem that latch-up occurs in which pn junction between the emitter and the base becomes conductive and the parasitic thyristor becomes conductive, leading to element breakdown or failure.

Although Document 1 described above considers the problem concerning the ratio between the surface area of the emitter region and the surface area of the base layer, it gives no consideration to the problem concerning the RBSOA when the stripe-like emitter region is employed.

Further, Document 2 describes that a dummy trench is provided to reduce an ejection area of holes, to increase a resistance of an ejection path for the holes for reducing transport current loss. However, although Document 2 shows, in FIG. 2 thereof, a structure having a trench formed in stripes, the emitter region in the structure is formed along the trench. Document 2 gives no consideration to the structure of the stripe-form emitter region formed in a direction orthogonal to the trench.

SUMMARY OF THE INVENTION

An object of the present invention is to provide a semiconductor device having a trench gate structure that can fully secure a reverse bias safe operation area and operates stably.

Another object of the present invention is to provide a trench IGBT capable of improving a margin of an RBSOA tolerance and fully suppressing variations in saturation current.

A semiconductor device according to the present invention includes a first semiconductor layer, a second semiconductor layer formed above the first semiconductor layer, and a plurality of trench regions formed being spaced away from each other and each formed extending from the second semiconductor layer to the first semiconductor layer. The trench regions include an effective gate trench region having a gate electrode layer formed on an inner wall with a gate insulating film interposed in between and electrically connected to a gate electrode, and a dummy trench region isolated from the gate electrode.

The semiconductor device according to the present invention further includes third semiconductor layers formed, on a surface of the second semiconductor layer, being orthogonal to the plurality of trench regions and spaced from each other and electrically connected to a first electrode layer. The third semiconductor layer has a width W along a direction in which the trench regions extend, in a portion contacting the first electrode layer, satisfying the following relation:

$$W \leq (K/Rspb) \cdot Wso \cdot F(m),$$

where K is a constant, Rspb is a sheet resistance of the second semiconductor layer, Wso is a pitch of the trench regions, and F( ) is a function of a decimation ratio, m, of the trenches, that is, a ratio of a number of the effective gate trench region to a total number of the plurality of trench regions.

A resistance R of the second semiconductor layer immediately below a contact region of the third semiconductor layer (an emitter layer in an embodiment) is considered to be substantially proportional to the following expression:

W·Rspb·F(the number of the effective gate trench regions/the total number of the trench regions)/Wso, with F being a function.

When resistance R of the second semiconductor layer (a base layer in the embodiment) immediately below the third semiconductor layer (the emitter layer in the embodiment) is too high, a large voltage drop occurs across the second semiconductor layer (the base layer in the embodiment) and an RBSOA is narrowed. The smaller resistance R of the second semiconductor layer immediately below the third semiconductor layer (the emitter layer in the embodiment), the smaller the voltage drop. In that case, however, minority carriers (holes in the embodiment) cannot be accumulated in the second semiconductor layer, and injection efficiency of majority carriers (electrons in the embodiment) is reduced. Therefore, to ensure stable operation and low on-voltage of the semiconductor device, resistance R of the second semiconductor layer is required to satisfy a certain condition (range).

As described above, resistance R is proportional to the width and length of the emitter layer and the decimation ratio. Constant K can be determined from results of simulation and experiments, and is, for example, 3500. Function F may be any function reflecting an area of a region where minority carriers in the semiconductor device move. Since a channel is not formed in the dummy trench, current by minority carriers in that region is excluded from consideration. Since a behavior of a natural/physical phenomenon is generally described by an exponential function exp(x) of a base e of natural logarithms relatively accurately, it is preferable to use exponential function exp(x) of a base e of natural logarithms as function F. When an upper limit value of resistance R is represented, for example, as Rmax, the following relational expression should be satisfied:

$$Rmax \sim Wmax \cdot Rspb/Wso,$$

where the mark "~" means "substantially equal". The mark "~" is also used in the following expression to give the meaning "substantially equal". Further, Wmax is a maximum value of a width of the third semiconductor layer along a direction in which the trenches extend, in a contact region. From the above expression, the following expression can be derived:

$$Wmax \sim (Rmax/Rspb) \cdot Wso.$$

Width W of the third semiconductor layer is set so as to set resistance R immediately below the emitter layer to be not greater than the maximum value Rmax of resistance R. In this case, there is a region where minority carriers (holes in the embodiment) are blocked by the dummy trench region. Therefore, the above relational expression is approximated by the following expression:

$$Wmax \sim (Rmax/Rspb) \cdot Wso \cdot F(m) \geq W.$$

By satisfying the above relational expression, the resistance of the second semiconductor layer can be set to a value in an appropriate range, minority carriers (holes in the embodiment) can be quickly ejected, turn-on of a parasitic thyristor can be prevented, and RBSOA can be fully secured. Further, by forming the third semiconductor layer (the emitter layer in the embodiment) in stripes extending in a direction orthogonal to the trenches, variations in saturation current can be suppressed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 schematically shows a cross sectional structure along a contact region arranged as shown in FIG. 6.

FIG. 8 shows the relationship between the width of the emitter layer and an RBSOA.

FIG. 9 shows the relationship between the width and interval and the diffusion depth of the emitter layer in the first embodiment of the present invention.

DESCRIPTION OF THE PREFERRED EMBODIMENTS

First Embodiment

Figure 1:
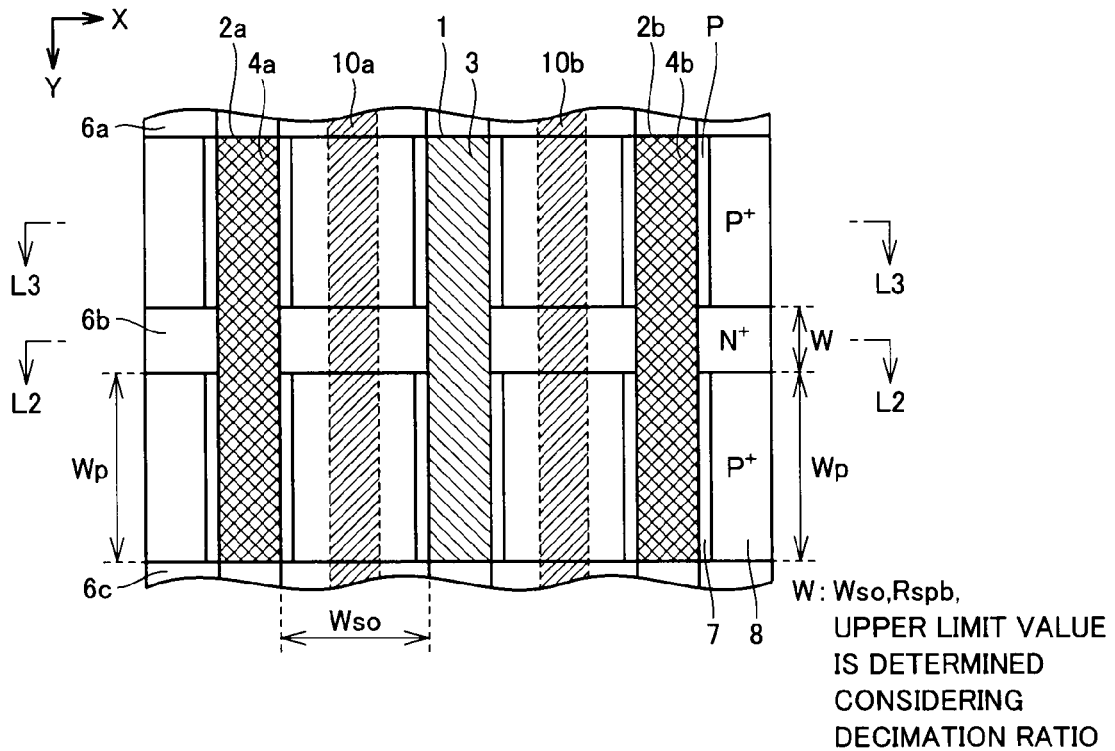
FIG. 1 schematically shows a planar layout of an IGBT in accordance with a first embodiment of the present invention.

FIG. 1 schematically shows a surface layout of an IGBT in accordance with a first embodiment of the present invention. In FIG. 1, an emitter electrode is not shown for brevity of the drawing.

In FIG. 1, trench regions 1, 2a, and 2b are provided linearly extending in a Y direction and being spaced from each other in an X direction. A gate electrode layer 3 is formed in trench region 1, and insulating materials 4a and 4b are deposited on inner walls of trench regions 2a and 2b, respectively. Trench regions 2a and 2b do not serve as gate electrodes, and are provided to narrow an ejection path for minority carriers (holes) to increase ejection resistance to the minority carriers (holes: hereinafter simply referred to as holes) for accumulating the holes.

Gate electrode layer 3 in trench region 1 forms a channel along a side wall of trench region 1 according to a voltage applied to gate electrode layer 3, and serves as an effective gate of a semiconductor device. In the description below, when the trenches are referred to individually, trench region 1 will be referred to as an effective gate trench region, and trench regions 2a and 2b will be referred to as dummy trench regions.

Emitter layers (third semiconductor layers) 6a, 6b, and 6c are formed in stripes at predetermined intervals (pitches) orthogonally to the direction in which trench regions 1, 2a, and 2b extend. Emitter layers 6a-6c each have a width W along the Y direction, are formed extending continuously in the X direction between trenches 1, 2a, and 2b, and are separated by trenches 1, 2a, and 2b.

A P base layer (second semiconductor layer) 7 is formed in regions between emitter layers 6a-6c and trenches 1, 2a, and 2b. A heavily-doped P-type layer 8 is provided on a surface of P base layer 7 in regions except emitter layers 6a-6c.

An emitter electrode (a first electrode layer) not shown is formed all over the surface of the semiconductor device, and the emitter electrode is electrically connected with N-type emitter layer 6b and heavily-doped P-type layer 8 in contact regions 10a and 10b.

In FIG. 1, trenches 1, 2a, and 2b are shown such that effective gate trench region 1 and dummy trench regions 2a and 2b are disposed alternately. However, dummy trench regions 2a and 2b are provided by an appropriate number, for example, two dummy trench regions per effective gate trench region (a decimation ratio m: 1/3), considering a withstand voltage between current paths due to blocking of hole ejection.

As shown in FIG. 1, in the IGBT, a gate electrode is formed into a trench structure to reduce layout area of a unit cell (a region formed of the effective gate trench region and the emitter layer). Further, since the gate electrode is formed extending beyond P base layer 7, as will be described later in detail, and electrons re injected over a channel on the side of the trench into an N base layer (a drift layer: a first semiconductor layer), the on-voltage can further be reduced.

Furthermore, as will be described later in detail, width W of emitter layer 6 (6a-6c), a sheet resistance Rspb of underlying P base layer 7, and a trench interval Wso are set to satisfy a predetermined condition for stable operation.

Figure 2:
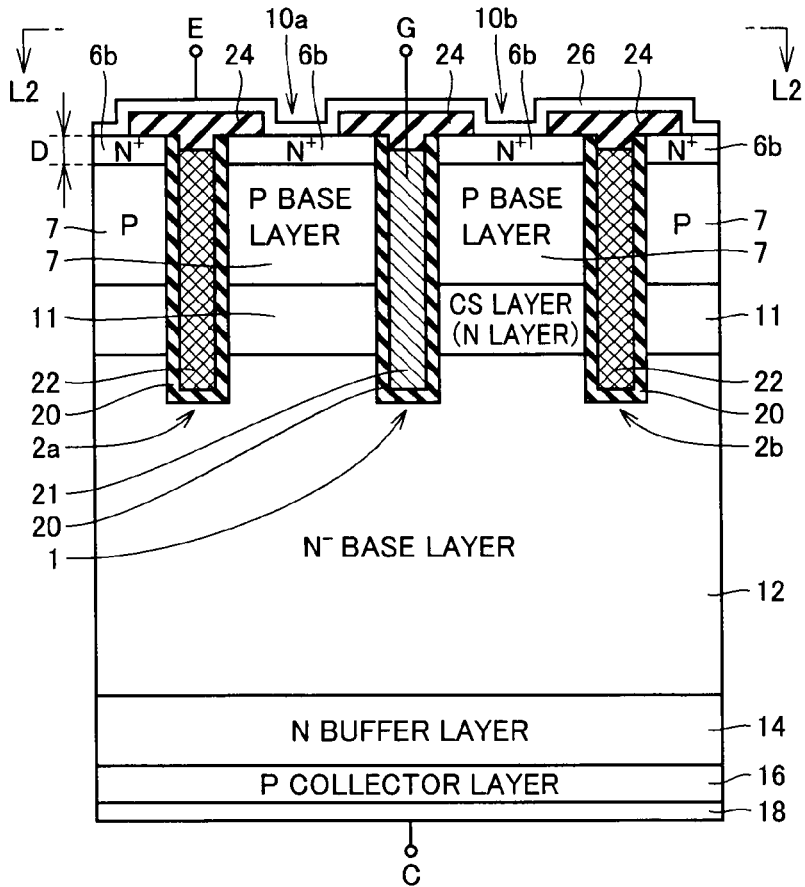
FIG. 2 schematically shows a cross sectional structure along line L2-L2 shown in FIG. 1.

FIG. 2 schematically shows a cross sectional structure along line L2-L2 shown in FIG. 1. In FIG. 2, N emitter layer 6b, which is a heavily-doped N-type impurity layer, is formed on the surface of P base layer 7. N emitter layer 6b has a diffusion depth D, and has N-type impurities heavily injected. Diffusion depth D is set to a value not greater than width W of emitter layer 6b, and the relationship between the width and the diffusion depth of N emitter layer 6b will be described later.

Under P base layer 7, a charge storage layer (CS layer) 11, an N base layer (drift layer) 12, an N-type buffer layer 14, a P-type collector layer 16, and a collector electrode layer 18 are formed sequentially. Charge storage layer (CS layer) 11, which is an N-type layer, prevents holes from passing to the emitter region by means of PN junction between P base layer 7 and charge storage layer 11, and stores holes in charge storage layer 11, thus improving the efficiency of electron injection from emitter layer 6 (6a-6c) and reducing the on-voltage. Further, in the case of a trench gate structure, a phenomenon that the spreading of a depletion layer upon channel formation reduces an area of a current flowing path (an N base layer region under the gate electrode) and narrows the current path does not occur, and thus current can efficiently be supplied and the on-voltage can further be reduced.

N base layer (drift layer) 12 is a lightly-doped N-type semiconductor layer, and most of the collector to emitter voltage is applied across N base layer 12 in an OFF state. N-type buffer layer 14 is provided to quickly absorb holes upon turn off, and to increase the withstand voltage of N base layer 12. P-type collector layer 16 injects holes from collector electrode layer 18 upon turn on.

N buffer layer 14 is provided for limiting the amount of holes injected from P collector layer 16 to N base layer 12, and for suppressing a depletion layer in N base layer 12 from contacting with collector layer 16 to cause a punch-through state.

Trench regions 1, 2a, and 2b are formed deep so as to pass through P base layer 7 and charge storage layer 11 to reach N base layer 12. A gate insulating film 20 is formed on each trench inner wall of trench regions 1, 2a, and 2b. In effective gate trench region 1, a conductive gate electrode material (gate electrode layer) 21 fills up on gate insulating film 20, and is connected to a gate electrode G. In dummy trench regions 2a and 2b, an insulating material 22 fills up on corresponding trench insulating films 20 and isolated from gate electrode G. Alternative to such structure, dummy trench regions 2a and 2b each may be filled with a conductive material, instead of insulating material 22, but no electrical connection is formed with gate electrode G, and the conductive material in dummy trench regions 2a and 2b is electrically separated from the gate electrode.

An insulating film 24 is formed on trench regions 1, 2a, and 2b. Insulating film 24 is formed along trench regions 1, 2a, and 2b, in regions except contact regions 10a and 10b shown in FIG. 1. An emitter electrode layer 26 is formed on the surface of the semiconductor device. Emitter electrode layer 26 is electrically connected with underlying N emitter layer 6b in contact regions 10a and 10b. Emitter electrode layer 26 is electrically separated from gate electrode layer 21 of effective gate trench region 1 by insulating film 24.

Figure 3:
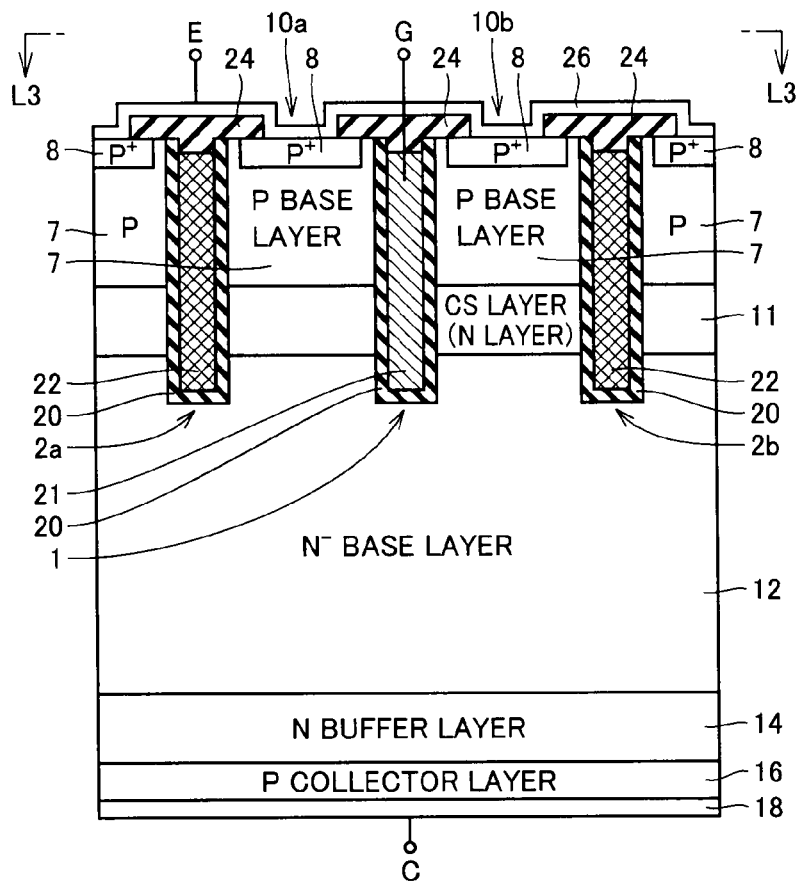
FIG. 3 schematically shows a cross sectional structure along line L3-L3 shown in FIG. 1.

FIG. 3 schematically shows a cross sectional structure along line L3-L3 shown in FIG. 1. The cross sectional structure shown in FIG. 3 is different in construction from the cross sectional structure of the IGBT shown in FIG. 2, in the points described below. Specifically, instead of N emitter layers 6a-6b, heavily-doped P-type layer 8 is provided on the surface of P base layer 7. P-type layer 8 is electrically connected with emitter electrode layer 26 in each of contact regions 10a and 10b. Otherwise, the cross sectional structure of the IGBT shown in FIG. 3 is the same as that shown in FIG. 2. Corresponding portions are allotted the same reference numerals, and the detailed description thereof will not be repeated.

P-type layer 8 and N emitter layer 6 (6a-6c) are kept at the same potential to suppress injection of holes from the emitter electrode at the time of turn on, to speed up ejection of stored holes at the time of turn off.

The IGBT shown in FIGS. 1 to 3 operates as follows. A sufficient positive voltage is applied between gate electrode G and an emitter electrode E. Accordingly, a channel is formed in P base layer 7 along a trench side wall of effective gate trench region 1, a MOSFET (Metal Oxide Semiconductor Field Effect Transistor: an insulated gate field effect transistor) formed of N emitter layer 6 (6a-6c), P base layer 7, charge storage layer 11, N base layer 12, and effective gate trench region 1 is brought into an ON state, and electrons are injected from N emitter layer 6 (6a-6c) to N base layer 12 via charge storage layer 11. Further, at this time, P collector layer 16 and N base layer 12 are forward-biased, and holes are injected from P collector layer 16 to N base layer 12 via collector electrode layer 18 connected to a collector electrode C. Since holes are injected into N base layer 12, electrons are accordingly injected into N base layer 12. Due to conductivity modulation of N base layer 12, the base layer has its resistance further reduced, and thus the IGBT turns into an ON state.

In this operation, charge storage layer 11 suppresses transfer of holes to emitter layer 6 by its PN junction, holes are injected into charge storage layer 11, and electrons are injected from emitter layer 6 to charge storage layer 11. Thereby, the on-voltage is further reduced (the impurity concentration of charge storage layer 11 is higher than the impurity concentration of N base layer 12).

To turn off the IGBT, gate electrode G is set to a voltage level not higher than the voltage of emitter electrode E. Accordingly, the channel along the trench side wall of effective gate trench region I disappears, and the MOSFET turns into an OFF state. The injection of holes from collector layer 16 is also stopped. Holes stored in N base layer 12 and charge storage layer 11 disappear due to recombination with electrons, or are ejected via P collector layer 16 and collector electrode layer 18, and discharged to emitter electrode E via P base layer 7, P-type layer 8, and N emitter layer 6 (6a-6c). When the discharging of holes is completed, the IGBT is set into an OFF state.

By forming N emitter layer 6 in stripes, the amount of electrons injected from N emitter layer 6 is suppressed, to suppress an increase in saturation current. Further, by providing dummy trench regions 2a and 2b, the ejection path for holes can be restricted, the resistance against holes upon ejection of holes can be increased, and transport current loss can be reduced.

Figure 4:
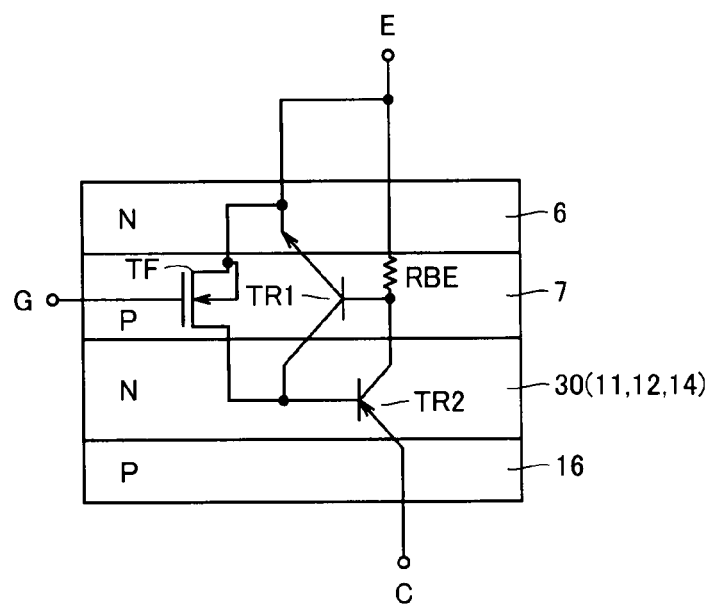
FIG. 4 shows an electrical equivalent circuit of a parasitic transistor of the IGBT shown in FIGS. 1 to 3.

FIG. 4 shows an electrical equivalent circuit of the IGBT shown in FIGS. 1 to 3. In FIG. 4, the IGBT includes N emitter layer 6, P base layer 7, an N-type semiconductor layer 30, and P collector layer 16. N-type semiconductor layer 30 includes charge storage layer (CS layer) 11, N base layer 12, and N buffer layer 14 shown in FIGS. 2 and 3 .

In the IGBT, an N channel MOS transistor TF is formed with N emitter layer 6 being a source, P base layer 7 being a substrate region (back gate region), and N-type semiconductor layer 30 being a drain. Further, an NPN bipolar transistor TR1 is formed with N emitter layer 6 being an emitter, P base layer 7 being a base, and N-type semiconductor layer 30 being a collector. Furthermore, a PNP bipolar transistor TR2 is formed with N base layer 7 being a collector, N-type semiconductor layer 30 being a base, and P collector layer 16 being an emitter. The base of bipolar transistor TR1 is coupled to emitter electrode E via a base resistance RBE.

Therefore, as shown in FIG. 4, at the time of turn on, MOS transistor TF turns into an ON state, electrons are injected from N emitter layer 6 to the base of bipolar transistor TR2 via MOS transistor TF, and bipolar transistor TR2 turns into an ON state.

At the time of turn off, MOS transistor TF turns into an OFF state, and the injection of electrons to the base of bipolar transistor TR2 is stopped. If base resistance RBE is high at the time of turn off, the base to emitter of bipolar transistor TR1 is forward-biased due to voltage drop caused by hole current, and bipolar transistor TR1 is brought into a turned-on state. In this state, a thyristor of an NPNP structure turns into an ON state, that is, bipolar transistors TR1 and TR2 are both brought into an ON state, causing a latch-up phenomenon and leading to element breakdown or failure. Parasitic resistance RBE between the base and the emitter is determined by a resistance value of P base layer 7, and set to a value not causing the latch-up phenomenon. Normally, when emitter layer 6 (6a-6c) is formed in stripes, holes are ejected by heavily-doped P-type semiconductor layer 8 formed on the surface of P base layer 7 to achieve suppression of the latch-up phenomenon.

Figure 5:
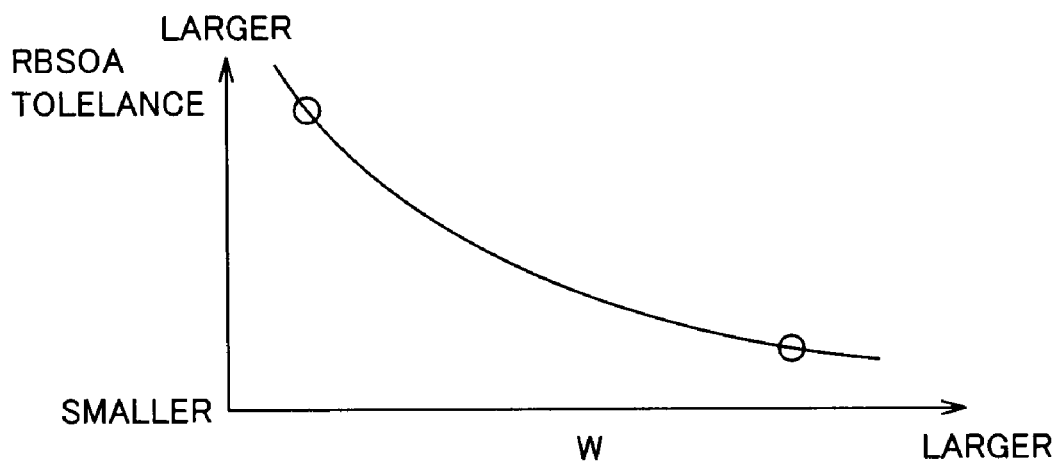
FIG. 5 schematically shows the relationship between the width of an emitter layer and an RBSOA tolerance.

According to the study by the inventors of the present invention, however, it is found out that, when employing emitter layer 6 formed in stripes, there exists a dependency between width W of emitter layer 6 and a tolerance of a reverse bias safe operation area (RBSOA) at the time of turn off, as shown in FIG. 5. In particular, it is found that width W of the emitter layer is an important factor determining a margin of the RBSOA tolerance. In FIG. 5, the ordinate axis represents the RBSOA tolerance, and the abscissa axis represents width W of the emitter layer. As shown in FIG. 5, the RBSOA tolerance is decreased with an increase in width W of the emitter layer. In the following, a condition for the width of the emitter layer for improving the RBSOA tolerance will specifically be described.

Figure 6:
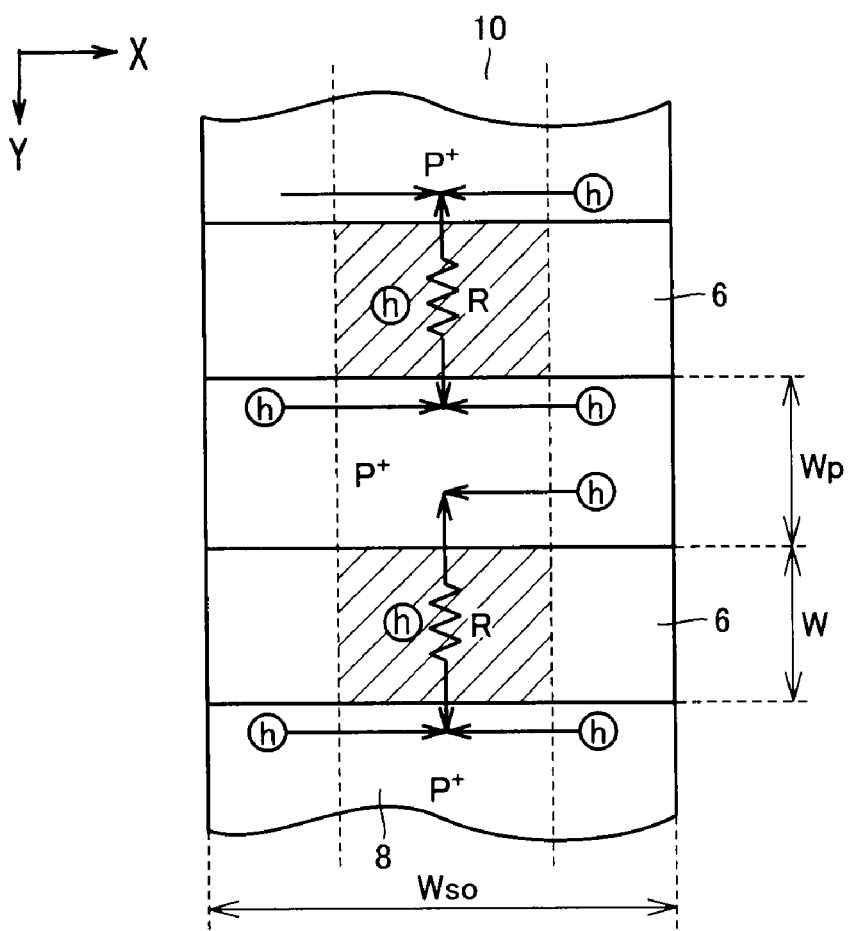
FIG. 6 schematically shows an ejection path for holes when the IGBT in accordance with the first embodiment of the present invention is turned off.

FIG. 6 schematically shows a planar layout along contact region 10 of the IGBT according to the first embodiment of the present invention. N emitter layers 6 are disposed at predetermined pitches in a direction (X direction) orthogonal to a direction (Y direction) in which contact region 10 extends. P-type layer 8 is provided between N emitter layers 6 along the Y direction. P base layer (7) is provided below N emitter layer 6 and P-type layer 8.

As shown in FIG. 6, at the time of turn off, between the trench regions (not shown), most of holes, h, stored or accumulated in the base layer are ejected via P-type layer 8. Specifically, since the stored holes immediately below the emitter layer are not ejected via the overlying emitter layer, they move below the emitter layer and are ejected from P-type layer 8. A resistance R of the P base layer is present below emitter layer 6, and voltage drop is caused by resistance R and the hole current in the P base layer immediately below emitter layer 6.

FIG. 7 schematically shows a cross sectional structure in the planar layout shown in FIG. 6, along the direction in which contact region 10 extends (Y direction). In FIG. 7, P-type layer 8 and N emitter layer 6 are disposed on the surface of P base layer 7. At the time of turn off, stored holes, h, in P base layer 7 are ejected to an emitter electrode not shown via P-type (semiconductor) layer 8. Therefore, stored holes, h, immediately below N emitter layer 6 move from P base layer toward P-type layer 8 via resistance R, and then are ejected via the emitter electrode not shown. When holes, h, move via resistance R of P base layer 7 immediately below emitter layer 6, voltage drop occurs across resistance R. Due to the voltage drop, P base layer 7 immediately below the N emitter layer becomes higher in potential than N emitter layer 6. As a result, PN junction between the base and the emitter (TR1) becomes conductive, causing a latch-up phenomenon and deteriorating the RBSOA tolerance. Hereinafter, a condition for resistance R will be considered.

As resistance R of P base layer 7 below emitter layer 6, a resistance component in the direction along contact region 10 (Y direction) will be considered. In this case, resistance R is expressed by the following equation:

$$R = Rspb \cdot W/Wso,$$

where Rspb is a sheet resistance ($\Omega/\square$) of P base layer 7, W is a width of emitter layer 6 along the direction in which the contact region extends (Y direction), and Wso is a distance between the trenches (a trench interval).

As width W of emitter layer 6 increases, resistance R increases accordingly. When a resistance value of resistance R not causing latch-up (an upper limit resistance value) is represented as Rmax, a width Wmax corresponding to the maximum resistance value Rmax is expressed by the following equation:

$$Wmax = Rmax \cdot Wso/Rspb.$$

As to an effective area of a region where holes, h, move, the dummy trench region is provided to reduce a hole ejection area. Accordingly, consideration will be given to express the effective area by a function of the number of the dummy trench regions and the number of the effective gate trench regions (the trench region serving as a gate electrode). Therefore, in this case, Wmax is approximated by the following equation:

$$Wmax = (Rmax/Rspb) \cdot Wso \cdot F(m).$$

In the equation, m is a "decimation ratio" of the trench, represented by a ratio of a number Tef of the effective gate trench regions to a number Tall of all the trench regions, that is, Tef/Tall. Further, since a current flowing in the Y direction in FIG. 6 is taken account as for the hole current, in the equation employed when calculating the resistance value of the P base layer, a length component in "sheet resistance Rspb·length/width" corresponds to the width of emitter layer 6.

As for function F( ), an exponential function exp(x) of a base, e, of natural logarithms (Napier's constant) is used because of the following reasons. Specifically, exp(x) is commonly employed as an optimum approximation in the description of a behavior of a natural phenomenon, and in particular a behavior of electrical charges, impurity distribution, or the like is optimally approximated in many cases by employing exponential function exp(x) of base, e, of natural logarithms. Therefore, it is considered that exp(x) can effectively approximate a behavior of the hole current. Further, it is also considered that, by employing decimation ratio m, an effect on the hole current when the dummy trench region blocks the ejection path for holes, that is, an ejection amount of holes h per emitter contact, can effectively be approximated.

Further, it is experimentally confirmed that resistance value Rmax is approximated by a value of 3500, considering a semiconductor material actually used and a latch-up tolerance. Therefore, width W of emitter layer 6 is required to satisfy the following relationship:

$$W \leq (3500/Rspb) \cdot Wso \cdot \exp(m) \sim Wmax.$$

By setting the upper limit value of width W of emitter layer 6 to satisfy the above relational expression, the resistance of the P base layer immediately below the emitter layer can be set to a value not greater than the value causing latch-up, and thus the margin of the RBSOA tolerance can be increased.

FIG. 8 shows a result of a test on the dependency of the RBSOA on emitter width W. The IGBT used for the test is a charge storage-type trench IGBT (the IGBT having the cross sectional structures shown in FIGS. 1 to 3) having a withstand voltage of 1.7 kV and a rated collector current of 150 A. In this case, 300 A, which is double the rated value, is required in the RBSOA for a value of the guaranteed collector current. In FIG. 8, the ordinate axis represents a collector current $I_C$ (unit: A), and the abscissa axis represents a collector voltage $V_{CE}$ (unit: V). In FIG. 8, curves I, II, and III represent characteristic curves of the IGBTs having emitter width W of 3.4 µm, 2.8 µm, and 2.4 µm, respectively.

As shown in FIG. 8, when emitter width W is 3.4 µm, collector current $I_C$ lower than the region shown as the RBSOA can only be supplied, as indicated by curve I. In contrast, as emitter width W is reduced, collector current $I_C$ that can be driven is increased, the RBSOA tolerance is improved, and thus the margin of the RBSOA tolerance is improved, as indicated by curves II and III.

Consequently, emitter width W has its upper limit value Wmax, and the margin of the RBSOA tolerance can be improved by setting emitter width W so as to satisfy the relational expression described above. It is to be noted that emitter width W shown in FIG. 8 is a width obtained after the IGBT is manufactured, including lateral diffusion. Next, an lower limit value of width W of emitter layer 6 will be considered.

FIG. 9 schematically shows the relationship between width W and diffusion depth D of N emitter layer 6. Width W of N emitter layer 6 is set to be not less than its diffusion depth D ($W \geq D$). Specifically, when N emitter layer 6 is formed, impurities are implanted and diffused in a depth direction. In this case, impurities are also diffused in a lateral direction. Therefore, the effect of variations in the diffusion distance of impurities in the lateral direction upon impurity diffusion, can be suppressed by setting the lower limit value of the width of emitter layer 6 to be not less than diffusion depth D of the emitter layer. Thereby, a minimum necessary emitter width can be secured to secure a length for ejecting holes, and emitter layer 6 can be formed stably. As a result, an electron injection region and a hole ejection region can be secured in emitter layer 6, and a stable characteristic for the RBSOA tolerance can be achieved.

Further, an interval Wp between N emitter layers 6 along the direction in which the trench extends (Y direction) is set to a value not less than W+2·D. Thus, there can be prevented the short-circuiting between N emitter regions 6m and 6n due to lateral diffusion of impurities when the distance between an N emitter layer 6m and an N emitter layer 6n in FIG. 9 is, for example, emitter width W. Further, it can be suppressed that the area of the N emitter layer adjacent to the trench is increased to increase the area where the collector current flows, to increase the saturation current. Furthermore, a sufficient area can be secured for heavily-doped P-type layer 8 between the emitter layers, a contact resistance between P-type layer 8 and the emitter electrode layer in contact region 10 (10a, 10b) can be reduced, a resistance to holes ejected from the P-type layer can be reduced, and holes can be quickly ejected upon turn off. Further, it is possible to prevent PN junction with the emitter layer from becoming conductive to cause latch-up, and to achieve the RBSOA tolerance reliably.

Figures 10, 11:
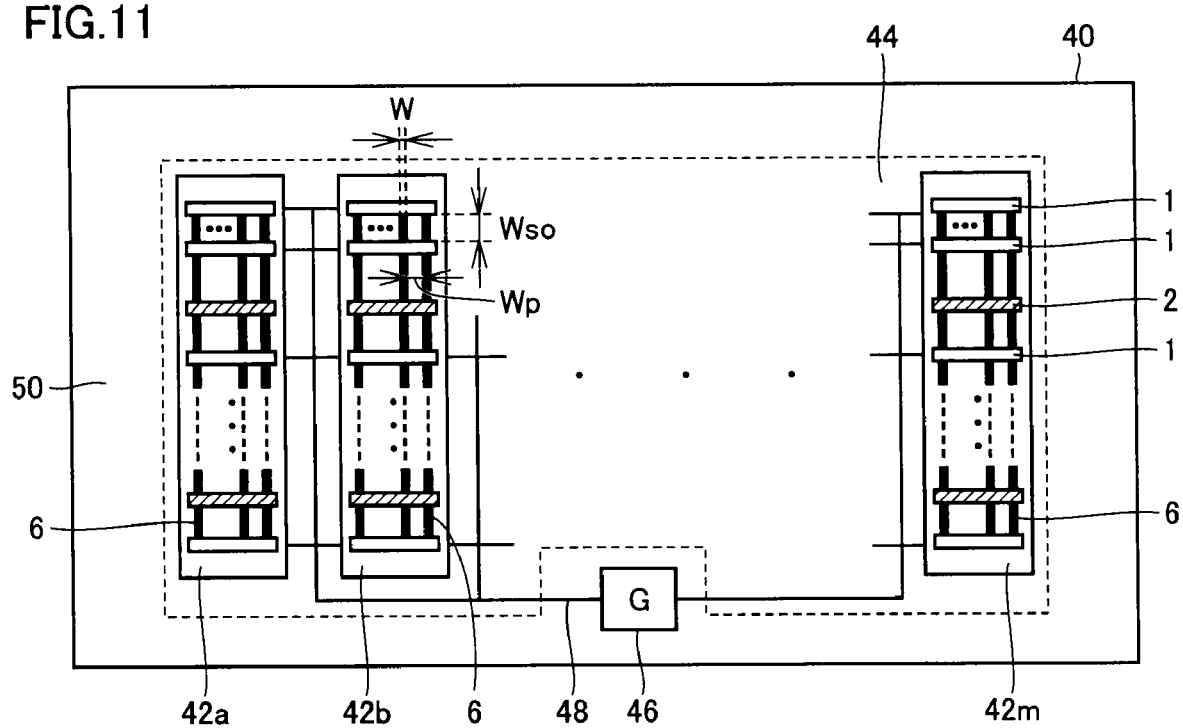
FIG. 10 shows the result of a test on the RBSOA tolerance of the IGBT in accordance with the first embodiment of the present invention.
FIG. 11 schematically shows an entire configuration of the IGBT in accordance with the first embodiment of the present invention.

FIG. 10 shows, in a list form, the result of a test on the RBSOA tolerance of the IGBT in accordance with the first embodiment of the present invention. In FIG. 10, conditions for the test are as follow: collector current $I_C$=500 A, collector voltage $V_{CE}$=1700 V, width W of the emitter layer=2.8 μm, trench interval Wso=2.6 μm, decimation ratio=1/3, and the diffusion depth (D) of the emitter layer=0.5 μm. These conditions are the same for each sample.

As test samples, samples of the following conditions are employed: interval Wp between the emitter layers is 3.0 μm, 4.0 μm, and 5.0 μm, and sheet resistance Rspb of the P base layer is 4600 Ω/□, 4100 Ω/□, and 3400 Ω/□.

In FIG. 10, when sheet resistance Rspb of the P base layer is 4600 Ω/□, breakdown is caused in any condition for the interval between the emitter layers (indicated by a mark x). In contrast, as to the samples having sheet resistance Rspb of the P base layer of 4100 Ω/□, element breakdown or failure is caused in the sample having the emitter layer interval Wp of 3.0 μm, whereas element breakdown is not caused in the samples having emitter layer interval Wp of 4.0 μm and 5.0 μm, and the samples operate stably.

Further, for the sample with sheet resistance Rspb of the P base layer being 3400 Ω/□, measurement is not performed for the sample having the emitter layer interval Wp of 3.0 μm, whereas the samples having the emitter layer interval Wp of 4.0 μm and 5.0 μm operate stably.

The relational expression for emitter width W described above:

$$W(=2.8) \leq (3500/Rspb) \cdot Wso \cdot \exp(m)$$

is approximated by the following equation:

$$W(=2.8) \leq 12649/Rspb \quad (1).$$

Therefore, when sheet resistance Rspb is 4600 Ω/□, the right side of the above inequation (1) has a value of about 2.53, which is smaller than 2.8 μm, and thus the relational expression for emitter width W is not satisfied. In contrast, when sheet resistance Rspb is 4100 Ω/□, the right side of the above inequation (1) has a value of about 3.09, which is greater than emitter width W (=2.8 μm), and thus the relational expression for emitter width W is satisfied. Similarly, when sheet resistance Rspb is 3400 Ω/□, the right side of the above inequation (1) has a value of about 4.08, which is greater than emitter width W (2.8 μm), and thus the relational expression for emitter width W is satisfied. Consequently, it is confirmed that the RBSOA is secured by satisfying the conditional expression for the upper limit value of emitter width W described above.

Next, the relationship between emitter diffusion depth D, width W of the emitter layer, and interval Wp between the emitter layers will be considered for the IGBTs having sheet resistance Rspb of 4100 Ω/□. The lower limit value of emitter layer interval Wp is 2.8+2·0.5=3.8. Therefore, in the element with interval Wp between the emitter layers being 3.0 μm, the condition Wp≧W+2·D is not satisfied, and thus element breakdown is caused. In contrast, in the elements with interval Wp between the emitter layers being 4.0 μm and 5.0 μm, the condition for the lower limit value of interval Wp between the emitter layers is satisfied, and thus the elements operate stably. That is, it can be confirmed that the condition that the lower limit value of interval Wp between the emitter layers is W+2·D should be satisfied for securing the RBSOA tolerance.

As to the elements having sheet resistance Rspb of 3400 Ω/□, measurement is not performed for the element having emitter layer interval Wp of 3.0 μm. This is because, for the element with emitter layer interval Wp of 3.0 μm, the condition for the lower limit value of the interval between the emitter layers is also not satisfied, and thus it is inferred that breakdown is caused.

It is to be noted that the condition that width W of the emitter layer is 2.8 μm and is greater than diffusion depth D (=0.5 μm) is satisfied in all the elements.

FIG. 11 schematically shows an entire configuration of the IGBT element (chip) according to the first embodiment of the present invention. In FIG. 11, an IGBT 40 includes a plurality of unit blocks 42a-42m. In each of unit blocks 42a-42m, effective gate trench region 1 and dummy trench region 2 are disposed at predetermined intervals Wso, and emitter layer 6 is formed in stripes in a direction orthogonal to the trench regions 1 and 2. Emitter layer 6 has width W, and the interval between emitter layers 6 is Wp. An emitter electrode layer 44 is disposed above and over unit blocks 42a-42m to supply emitter voltage in common. Further, a gate electrode pad 46 is provided in common for unit blocks 42a-42m, and gate electrode layers in the trenches of effective gate trench regions 1 of unit blocks 42a-42m are coupled in common via a gate electrode interconnects 48.

In IGBT 40, the number of unit blocks 42a-42m is determined according to its rated current amount. Withstand voltage is accommodated by adjusting the arrangement of a guard link provided in a chip peripheral region 50 of IGBT 40, the film thickness of the N base layer (wafer film thickness), and the like. The foregoing condition for the emitter layer in each of unit blocks 42a-42m is satisfied in common in each withstand voltage class.

The number of dummy trench region 2 is determined so as to provide an appropriate decimation ratio, for example 1/3, according to on-voltage and withstand voltage, although the drive current is reduced when compared with a case where no dummy trench is provided. By determining the arrangement (decimation ratio) of the trench regions that is common in each of unit blocks 42a-42m, and adjusting the number of unit blocks 42a-42m according to the rated current amount, it becomes possible to accommodate for the required amount of current, and sufficiently secure the RBSOA tolerance.

Although the charge storage layer (CS layer) is employed in the IGBT in the above description, the charge storage layer may not be provided particularly. Further, although the N buffer layer is provided between the N base layer and the P collector layer to prevent punch-through and for other purposes, the N buffer layer may also not be provided.

Further, although the emitter layer having the same width W is provided linearly in a stripe form in a direction orthogonal to the trench regions, the emitter layer may have different widths in a region contacting the trench region and in a region contacting the emitter electrode layer. In this case, emitter width W satisfying the above relational expression is defined by a width of a region in which contact is made between the emitter layer and the emitter electrode (contact region).

Further, dummy trenches are provided in the above structure of the IGBT. When no dummy trench is provided, however, it only results in a decimation ratio of 1, and as to the above condition for the width of the emitter layer, it is sufficient to meet the condition with function exp(m) being replaced by the base e of natural logarithms (Napier's constant).

As described above, according to the present invention, in an IGBT having an emitter layer linearly formed in a direction orthogonal to a trench region, the width of the emitter layer is determined to satisfy predetermined functional relationship relating a sheet resistance of a P base layer and a trench interval. Accordingly, a resistance of a base layer below the emitter layer can be set to a value not causing element breakdown or failure, and an IGBT having low on-voltage, fully secured RBSOA tolerance, and less variations in saturation current can be implemented.

Further, by setting an interval between the emitter layers to an appropriate value, a contact region for a heavily-doped P-type layer can sufficiently be secured, a contact resistance between an emitter electrode and the heavily-doped P-type layer can sufficiently be reduced, and stable RBSOA tolerance can be achieved.

Furthermore, by setting the width of the emitter layer to be not less than a diffusion depth, variations in the width of the emitter layer can be suppressed to provide stable RBSOA tolerance.

The present invention is applicable to any trench IGBT having an emitter layer formed in stripes, and thereby an IGBT capable of fully securing RBSOA tolerance, suppressing variations in saturation current, and operating stably can be implemented.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device, comprising:
   a first semiconductor layer;
   a second semiconductor layer formed above said first semiconductor layer;
   a plurality of trench regions, each formed extending from said second semiconductor layer to said first semiconductor layer, formed being spaced from each other, the trench regions including an effective gate trench region having a gate electrode layer formed on an inner wall thereof with a gate insulating film interposed in between and electrically connected to a gate electrode, and a dummy trench region isolated from said gate electrode; and
   third semiconductor layers formed, on a surface of said second semiconductor layer, orthogonally to the plurality of trench regions and being spaced from each other, and electrically connected to a first electrode layer, the third semiconductor layer having a width W along a direction in which the trench regions extend, in a portion contacting said first electrode layer, satisfying the relation of:

$$W \leq (K/Rspb) \cdot Wso \cdot F(m),$$

where K is a constant, Rspb is a sheet resistance of the second semiconductor layer, Wso is a pitch of said trench regions, F( ) is a predetermined function, and m is a decimation ratio representing a ratio of a number of the effective gate trench region to a total number of said plurality of trench regions.

2. The semiconductor device according to claim 1, wherein said K is 3500, and said F(m) is represented by exp (m) that is an exponential function of a base, e, of natural logarithms.

3. The semiconductor device according to claim 1, wherein said W has a magnitude not less than a depth of the third semiconductor layer to said second semiconductor layer.

4. The semiconductor device according to claim 1, wherein an interval of adjacent said third semiconductor layers is not less than a sum of said W and double a depth of the third semiconductor layer to the second semiconductor layer.

5. The semiconductor device according to claim 1, wherein said third semiconductor layers each have a shape of a stripe linearly formed substantially with said width W.

* * * * *